(12) United States Patent
Joet et al.

(10) Patent No.: US 10,968,096 B2
(45) Date of Patent: Apr. 6, 2021

(54) MICROELECTRONIC SENSOR DEVICE WITH AN OUT-OF-PLANE DETECTION HAVING A CONTROLLED CROSS SENSITIVITY

(71) Applicant: COMMISSARIAT A L'ENERGIE ATOMIQUE ET AUX ENERGIES ALTERNATIVES, Paris (FR)

(72) Inventors: Loic Joet, Grenoble (FR); Patrice Rey, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/590,015

(22) Filed: Oct. 1, 2019

(65) Prior Publication Data

US 2020/0102211 A1 Apr. 2, 2020

(30) Foreign Application Priority Data

Oct. 2, 2018 (FR) ..................................... 18 59118

(51) Int. Cl.
*B81B 3/00* (2006.01)
*B81C 1/00* (2006.01)

(52) U.S. Cl.
CPC .......... *B81B 3/0072* (2013.01); *B81C 1/0015* (2013.01); *B81B 2201/0235* (2013.01);
(Continued)

(58) Field of Classification Search
CPC ................ B81B 3/0048; B81B 3/0072; B81B 2201/0235; B81B 2201/0242;
(Continued)

(56) References Cited

U.S. PATENT DOCUMENTS

| 9,581,188 B2 * | 2/2017 | Jourdan | .................... B81B 3/00 |
| 2014/0331770 A1 * | 11/2014 | Jourdan | .................... B81B 3/00 |
| | | | 73/514.01 |
| 2016/0130133 A1 * | 5/2016 | Boillot | .................. B81B 3/0048 |
| | | | 73/504.12 |

FOREIGN PATENT DOCUMENTS

| EP | 2 211 185 A1 | 7/2010 |
| FR | 3 000 050 A1 | 6/2014 |

OTHER PUBLICATIONS

French Preliminary Search Report dated Sep. 11, 2019 in French Application 18 59118 filed on Oct. 2, 2018 (with English Translation of Categories of Cited Documents).
(Continued)

*Primary Examiner* — Allan R Wilson
(74) *Attorney, Agent, or Firm* — Oblon, McClelland, Maier & Neustadt, L.L.P.

(57) ABSTRACT

Microelectromechanical sensor with an out-of-plane detection has a cross sensitivity in a first direction in the plane with a value of $S_T$, the sensor comprising a support, a mass suspended from the support by beams stressed by bending, in such a way that the inertial mass is capable of moving with respect to the support about an axis of rotation contained in a plane of the sensor, a stress gauge suspended between the mass and the support. The bending beams have a dimension $t_f$ in the out-of-plane direction and the mass has a dimension $t_M$ in the out-of-plane direction such that $$t_f = \frac{3}{4}(t_M - 2l_{arm}S_T).$$

(Continued)

$L_{arm}$ is the distance between the centre of gravity of the mass and the centre of the bending beams projected onto the first direction.

15 Claims, 10 Drawing Sheets

(52) U.S. Cl.
CPC ............... *B81B 2201/0242* (2013.01); *B81B 2201/0292* (2013.01); *B81B 2203/0118* (2013.01); *B81B 2203/056* (2013.01)

(58) Field of Classification Search
CPC ...... B81B 2201/025; B81B 2201/0292; B81B 2203/0118; B81B 2203/019; B81B 2203/056; B81C 1/0015
See application file for complete search history.

(56) References Cited

OTHER PUBLICATIONS

U.S. Appl. No. 15/248,756, filed Aug. 26, 2016, 2017/0059420 A1, Rey, P., et al.
U.S. Appl. No. 15/625,314, filed Jun. 16, 2017, 2017/0363424 A1, Maspero, F., et al.
U.S. Appl. No. 16/348,004, filed Mar. 7, 2019, Joet, L., et al.
U.S. Appl. No. 16/466,432, filed Jun. 4, 2019, Joet, L.

\* cited by examiner

MICROELECTRONIC SENSOR DEVICE WITH AN OUT-OF-PLANE DETECTION HAVING A CONTROLLED CROSS SENSITIVITY

TECHNICAL FIELD AND PRIOR ART

The present invention relates to a sensor with a microelectromechanical and nanoelectromechanical structure or MEMS&NEMS (microelectromechanical and nanoelectromechanical systems) with an out-of-plane detection.

MEMS&NEMS sensors with an out-of-plane detection are for example used to realise accelerometers, gyrometers, force or magnetic-field sensors. They comprise a mass suspended with respect to a support, which is intended to have an out-of-plane movement, i.e. substantially orthogonal to the plane of the sensor, under the effect of an outside force for example an acceleration or a Coriolis force.

The document FR 3 000 050 describes a microelectromechanical device used as a force sensor, comprising a mass suspended from a support by at least one beam intended to be deformed by bending and beams intended to be deformed by torsion. The beams define an axis of rotation and the mass pivots about this axis under the effect of an outside force. Piezoresistive gauges are suspended between the support and the mobile mass, each is stressed in tension or in compression. The electric resistance of the gauges varies proportionally to the stress applied to the mass and a signal is emitted by the gauges, this variation being representative of the out-of-plane movement of the mass.

In order to provide a sensor with good performance, it is sought to realise a sensor having a high sensitivity in the out-of-plane direction, called sensibility here, and a low sensitivity, or even an insensibility, in the directions of the plane.

The bending beams of the sensor of the document FR3 000 050 extend in a direction orthogonal to the out-of-plane direction and to the axis of the pivot. They have a high rigidity in this direction, which has the effect of substantially reducing the cross sensitivity in this direction, however they also have the effect of reducing the sensitivity in the out-of-plane direction.

The document EP 2 211 185 describes a MEMS sensor comprising a thick mobile mass, suspension beams having a thickness less than or equal to that of the mass and detection gauges having a thickness of less than the suspension beams. When the sensor is subjected for example to a force in a direction orthogonal to the out-of-plane direction and to the axis of the pivot, on the one hand the force exerts:
- a stress (tension or compression according to the direction of the force) on the suspension beams,
- a tension on a first gauge and a compression on a second gauge, which induces an elongation or a shrinkage of the gauges.

On the other hand, the forces applied are not coplanar, this results in a torque exerted on the mass which has an inverse effect on the gauges (compression of the first gauge and tension on the second gauge). These effects do not compensate for each other in general, this results in a non-zero differential stress in the gauges and thus a sensitivity of the sensor to a stress in the direction orthogonal to the out-of-plane direction and to the axis of the pivot.

Moreover this cross sensitivity is not controlled.

It is possible to overcome this parasite sensitivity, in the case in which the sensor with an out-of-plane detection is associated with at least one sensor with detection in the crosswise direction, indeed in this case the error due to the parasite sensitivity can be corrected, however this solution imposes the implementation of a second sensor, which increases the production cost and the bulk, and this results in a complexification of the electronics required.

DESCRIPTION OF THE INVENTION

It is therefore a goal of the present invention to offer a microelectromechanical and nanoelectromechanical sensor offering both a high sensitivity in the out-of-plane direction and a cross sensitivity controlled in a simple manner.

The goal stated above is achieved by a microelectromechanical and nanoelectromechanical sensor comprising a structure comprising a mass suspended from a support by suspension means in such a way as to be mobile in an out-of-plane direction, said suspension means comprising at least one beam stressed by bending. The sensor also comprises means for detection of the out-of-plane movement of the mass, comprising at least one stress gauge suspended between the support and the mass and extending orthogonally to the axis of rotation. The thickness of at least the bending beam is thus chosen with respect to the thickness of the mass, according to the cross sensitivity which is accepted for the sensor.

Indeed, the inventors have determined, in a surprising manner, that it is relatively easy to control the value of the cross sensitivity by adequately choosing the thicknesses of the beams stressed by bending and of the mass. They have determined that the thickness $t_f$ of the beam(s), which is or are stressed by bending, can be linked to the thickness of the mass $t_M$ and to the desired cross sensitivity $S_T$ by the following relation:

$$t_f = \frac{3}{4}(t_M - 2l_{arm}S_T)$$

With $l_{arm}$: distance between the centre of gravity of the seismic mass and the centre of the beam(s) stressed by bending projected onto the first longitudinal direction.

Thus, it is possible to determine the structure of the sensor in order for it to have the expected specifications in terms of cross sensitivity.

The mass is stressed about two different axes of rotation according to whether the stress is in the out-of-plane direction or in a direction contained in the plane. The inventors have determined that they could design a structure in such a way that the axis of rotation of the structure, when it is subjected to a stress in the plane, moves towards the middle plane of the stress gauge or of stress gauges. The closer this axis is to the middle plane of the gauges, the more the sum of the stresses in the plane seen by the gauges is reduced. The cross sensitivity of the structure is thus reduced. Preferably the axis of rotation of the structure, when it is subjected to a stress in the plane, is moved in such a way as to be located in the middle plane of the gauges in order to completely cancel out the sum of the stresses seen by the latter. The gauges do not therefore undergo any extension.

"Middle plane" means a plane parallel to the plane in which the structure extends, i.e. the plane XY, and located at an equal distance from the ends of the gauge in the out-of-plane direction.

Preferably, the desired cross sensitivity is at most 1%.

Very advantageously, by choosing one or more bending beams having a thickness equal to ¾ of the thickness of the mass, the MEMS&NEMS sensor has a cross sensitivity of zero.

Thanks to the invention, it is therefore possible to control or even avoid the error due to the cross sensitivity of the sensor without implementing a second sensor.

The subject-matter of the present invention is therefore a microelectromechanical sensor with an out-of-plane detection having a cross sensitivity with a value of $S_T$ according to, a first direction in the plane, said sensor comprising a support, an inertial mass suspended from the support by suspension means, a first axis of rotation about which the inertial mass pivots with respect to the support in an out-of-plane direction when the sensor is subjected to a stress in the out-of-plane direction, said suspension means comprising at least one first beam extending in the plane of the sensor, said at least one first beam being anchored by a longitudinal end to the support and by another longitudinal end to the inertial mass, in such a way that during a movement of the inertial mass in the out-of-plane direction, said at least first beam is stressed by bending, and means for detection of the movement of the mass in the out-of-plane direction, said detection means comprising at least one stress gauge suspended by a first end from the inertial mass and by a second end from the support and extending in parallel to said at least one first beam, wherein said at least first beam has a dimension $t_f$ in the out-of-plane direction and the inertial mass has a dimension $t_M$ in the out-of-plane direction such that $$t_f = \frac{3}{4}(t_M - 2l_{arm}S_T).$$

$l_{arm}$ being the distance between the centre of gravity of the inertial mass and the centre of the at least one first beam projected onto the first longitudinal direction.

Another subject-matter of the present invention is also a method for designing a microelectromechanical sensor with an out-of-plane detection having a cross sensitivity in a first direction in the plane with a value $S_T$, said sensor comprising a support, an inertial mass suspended from the support by suspension means in such a way that the inertial mass is capable of moving in rotation with respect to the support in an out-of-plane direction, about a first axis of rotation, said suspension means comprising at least one first beam extending in the plane of the sensor and orthogonally to the first axis of rotation of the suspension means, said at least one first beam being anchored by a longitudinal end to the support and by another longitudinal end to the inertial mass in such a way that during a movement of the inertial mass in the out-of-plane direction said at least first beam is stressed by bending, and means for detection of the movement of the inertial mass in the out-of-plane direction, said detection means comprising at least one first stress gauge suspended by a first end from the inertial mass and by a second end from the support and extending in parallel to said at least one first beam, the design method comprising a step of determination of the dimension $t_f$ in the out-of-plane direction of the at least one first beam and of the out-of-plane dimension $t_M$ of the inertial mass such that $$t_f = \frac{3}{4}(t_M - 2l_{arm}S_T).$$

$l_{arm}$ being the distance between the centre of gravity of the inertial mass and the centre of the at least one first beam projected onto the first direction.

Another subject-matter of the present invention is also a method for manufacturing a sensor according to the invention, comprising:
- the realisation of at least one first stress gauge in a first electrically conductive or semiconductor layer, formed on a barrier layer formed on a support layer
- the formation of a protective layer only on said at least one first stress gauge,
- the formation of a second electrically conductive or semiconductor layer on the first layer and on the protective layer, in such a way that the thickness of the first and of the second layer is equal to the thickness of the inertial mass $t_M$,
- the formation of a first mask in order to define the inertial mass,
- the formation of a second mask vertically aligned with the location of the at least first beam,
- the structuration of the first and second electrically conductive or semiconductor layers in such a way as to define the inertial mass and reach the protective layer of the at least one first gauge,
- the removal of the second mask,
- the thinning of the second electrically conductive or semiconductor layer in such a way as to remove a thickness of conductive or semiconductor material equal to $t_M - t_f$,
- the releasing of the inertial mass, of the at least one first gauge and of the at least first beam.

Another subject-matter of the present invention is also a method for manufacturing a sensor according to the invention, comprising:
- the realisation of at least one first stress gauge in a first electrically conductive or semiconductor layer, formed on a barrier layer formed on a support layer
- the formation of a protective layer only on said at least one first stress gauge,
- the formation of a second electrically conductive or semiconductor layer on the first layer and on the protective layer, in such a way that the thickness of the first and of the second layer is equal to the thickness of the first beam $t_f$,
- the formation of a barrier portion on the second electrically conductive or semiconductor layer vertically aligned with the location of the at least first beam,
- the formation of a third electrically conductive or semiconductor layer on the second electrically conductive or semiconductor layer and on the barrier portion, in such a way that the thickness of the first, of the second and of the third layer is equal to the thickness of the inertial mass $t_M$,
- the formation of a first mask in order to define the inertial mass and a second mask vertically aligned with the barrier portion,
- the structuration of the first, second and third electrically conductive or semiconductor layers in such a way as to define the inertial mass and reach the protective layer of the at least one first gauge,
- the removal of the second mask,
- the thinning of the second electrically conductive or semiconductor layer in such a way as to remove a thickness of conductive or semiconductor material equal to $t_M - t_f$,
- the releasing of the inertial mass, of the at least one first gauge and of the at least first beam.

BRIEF DESCRIPTION OF THE DRAWINGS

The present invention will be better understood on the basis of the following description and of the appended drawings in which.

DETAILED DESCRIPTION OF SPECIFIC EMBODIMENTS

The present invention applies to inertial sensors with a microelectromechanical and nanoelectromechanical structure or MEMS&NEMS or M&NEMS, i.e. comprising elements of a micrometric size, such as the mass and the beams for suspension of the mass, and elements of a nanometric size, such as the stress gauges. For reasons of simplicity, "microelectromechanical sensor" will designate a sensor comprising both one or more microelectromechanical elements and one or more nanoelectromechanical elements.

The plane of the sensor is the plane in which the sensor extends that is parallel to the substrate from which the sensor is manufactured. The directions of the plane are designated X and Y and the out-of-plane direction designated Z is orthogonal to the plane of the sensor and to the directions X and Y.

Moreover the sensors are inertial sensors with an out-of-plane detection, i.e. intended to detect a value in the out-of-plane direction Z. The sensors comprise at least one mass which is intended to be moved in the out-of-plane direction under the effect of a force resulting from the value to be detected, such as acceleration, Coriolis forces, a magnetic field, a force . . . .

The present invention allows to create M&NEMS sensors with an out-of-plane detection having a controlled cross sensitivity. "Cross sensitivity" or "parasite sensitivity" means the sensitivity of the sensor, i.e. the sensitivity of the detection means, to a value in a direction orthogonal to the out-of-plane direction Z and to the direction in the plane about which the mass is articulated, this direction is designated X. "Sensitivity" means the sensitivity of the sensor with an out-of-plane detection, to the value in the out-of-plane direction, i.e. to the value to be detected for which the sensor is designed.

Figure 1:
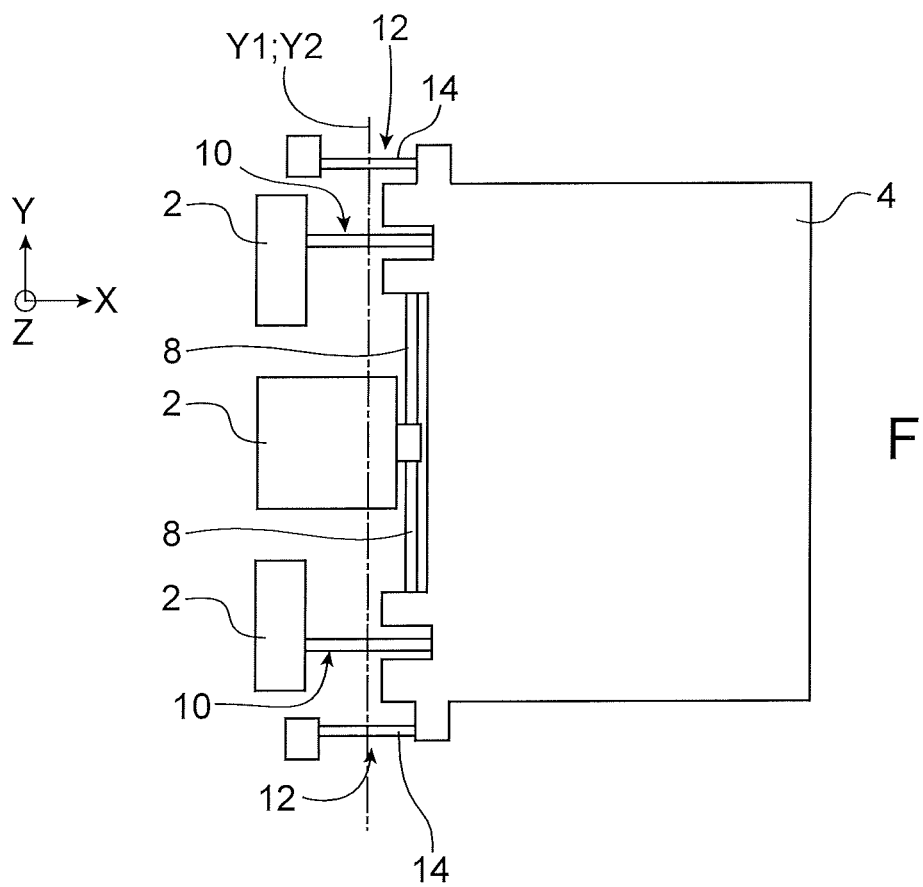
FIGS. 1 and 2 are top and side views, respectively, of another example of a MEMS & NEMS sensor with an out-of-plane detection to which the invention applies.
Figure 2:
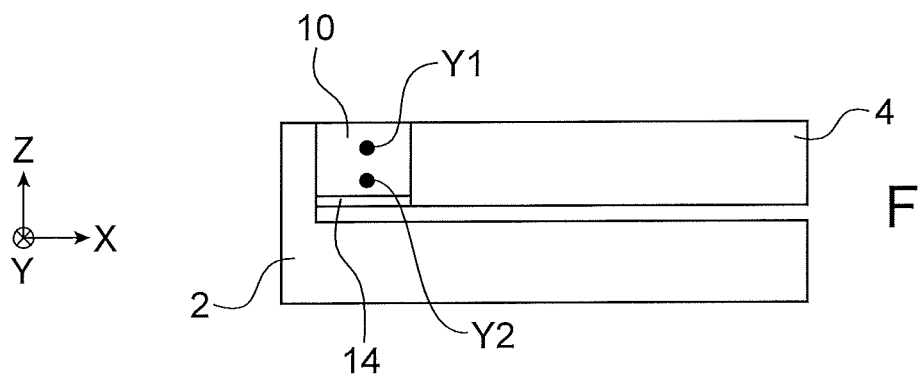

FIGS. 1 and 2 show a top view and a side view, respectively, of a microelectromechanical sensor with an out-of-plane detection to which the invention applies.

The sensor comprises a support 2 extending in a plane XY, a mass 4 suspended with respect to the support 2 in such a way as to be mobile with respect to the support in the out-of-plane direction Z.

The mass 4 is suspended from the support 2 by means 6 for articulation in rotation.

The articulation means 6 comprise, in the example shown, two beams 8 extending in the direction Y. Each beam 8 is on the one hand anchored, by a first longitudinal end, to the mass and, by a second longitudinal end, to the support. The beams 8 are intended to be deformed by torsion, when the mass is moved. The beams 8 ensure a retention in the direction Y.

The articulation means also comprise two first beams 10 extending orthogonally to the axis Y and anchored by a first end to the mass and by a second end to the support. The first beams 10 are intended to be stressed by bending.

When the mass is subjected to a stress according to Z, it moves in rotation with respect to the support 2 about a first pivot axis Y1 parallel to the direction Y. When the mass 4 is subjected to a stress along the X, it moves in rotation with respect to the support about a second pivot axis Y2 parallel to the direction Y.

The sensor also comprises means 12 for detection of the movement of the mass, comprising at least one stress gauge 14 suspended between the mass and the support in such a way as to undergo a stress in tension or of compression, when the mass moves about the axis Y1. Preferably, the detection means 12 comprise two stress gauges 14 mounted differentially in such a way that, when one gauge is stressed in tension, the other gauge is stressed in compression.

The stress gauges are for example piezoresistive or piezoelectric gauges.

In the example shown, the gauges are disposed in alignment of the face of the bending beams 10 and of the mass facing the support.

The locations of the first pivot axis Y1 and of the second pivot axis Y2 depend on the stiffnesses of the bending beams and of the gauges and on their thickness.

In FIGS. 1 and 2, the axes Y1 and Y2 are shown only for illustrative purposes.

Thanks to the invention, the first beams stressed by bending and the mass are dimensioned in such a way that the cross sensitivity $S_T$ or parasite sensitivity is controlled.

The inventors have determined that a relation could be established between the thickness of the mass, the thickness of the beams stressed by bending and the parasite sensitivity, in order to create a sensor structure having a parasite sensitivity with a given value, which can be zero.

Figure 3:
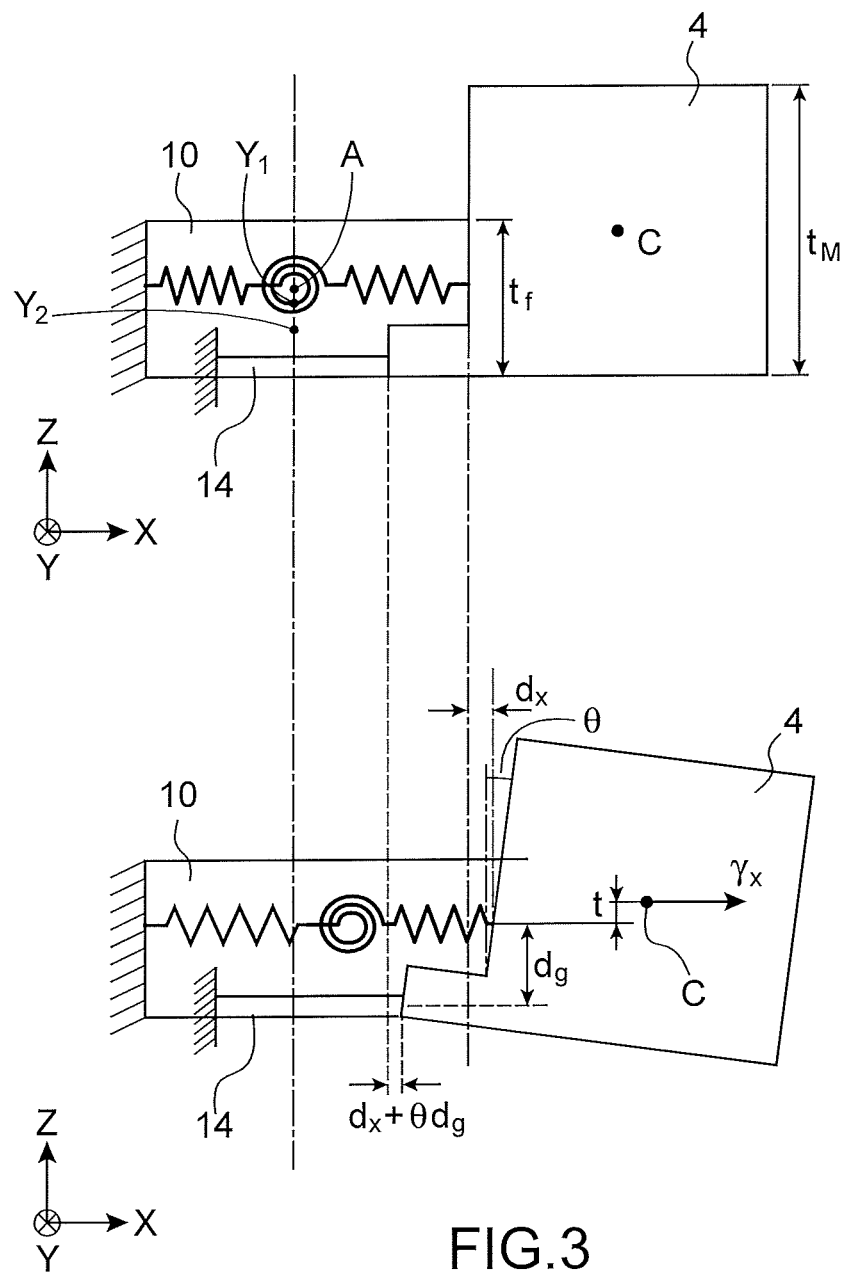
FIG. 3 is a diagrammatic representation of the sensor of FIGS. 1 and 2 undergoing an acceleration in the direction X.

FIG. 3 shows a sensor close to that of FIGS. 1 and 2 subjected to an acceleration $\gamma_x$ in the direction X.

θ is the angle of rotation of the mass with respect to the plane YZ and δx is the movement of the mass in the direction X under the effect of the acceleration $\gamma_x$. The translation of the mass is expressed in the middle of the bending beams The torsion beams cause an out-of-plane stiffness such that the movement in Z is considered to be negligible. Inversely, their stiffness in X is considered to be negligible and they will not be taken into account in the total force below.

The case is considered in which θ is small.

In the case in which θ is large, the expressions would be different but the relation between the thicknesses of the mass and of the bending beams is the same.

When the structure is subjected to an acceleration $\gamma_x$ in the direction X, it is subjected to the following forces:

An inertial force: $F_i = m\gamma_x$, m being the mass of the inertial mass.

A return force of the bending beams applied by the bending beams: $F_{rf}=k_f\delta x$, with $k_f$ the stiffness of the two beams 14'.

A return force of the gauge: $F_{rg}=k_g(\delta x+\theta d_g)$, with $k_g$ the stiffness of the gauge.

$d_g$ is the distance between the middle of the bending beams and the middle plane XY of the gauges, in the direction Z.

By writing the equilibrium of the forces and the equilibrium of the moments in the point A, the following system is obtained:

$$m\gamma_x - k_f\delta x - k_g(\delta x+\theta d_g)=0 \quad (1)$$

$$m\gamma_x t + C_s\theta + k_g(\delta x+\theta d_g)d_g = 0$$

With $C_s$ the rotary spring constant (or angular stiffness) of the bending beams, and t the distance between the two planes XY respectively containing the centre of gravity C of the mass and the first axis of rotation Y1. It should be noted that in the case of the structure shown in FIGS. 3 and 4, in which the middle plane of the bending beams is the same as that of the gauges, the axes of rotation Y1 and Y2 are located in the plane YZ passing through the middle of the bending beams and of the gauges.

From the system of equation (1), the expression of the elongation of the gauge when the structure is subjected to an acceleration along the axis X is calculated:

$$\delta x = d_g \theta = m\gamma_x \frac{\frac{1}{k_f} - d_g\frac{t}{C_s}}{1 + \frac{k_g}{k_f} + \frac{k_g d_g^2}{C_s}}$$

The force exerted on the gauge, which is equal to the product of its stiffness times its elongation, is then calculated:

$$F_{gau} = k_g(\delta x + d_g\theta) = m\gamma_x \frac{\frac{1}{k_f} - t\frac{d_g}{C_s}}{\frac{1}{k_g} + \frac{1}{k_f} + \frac{d_g^2}{C_s}}$$

Figure 4:
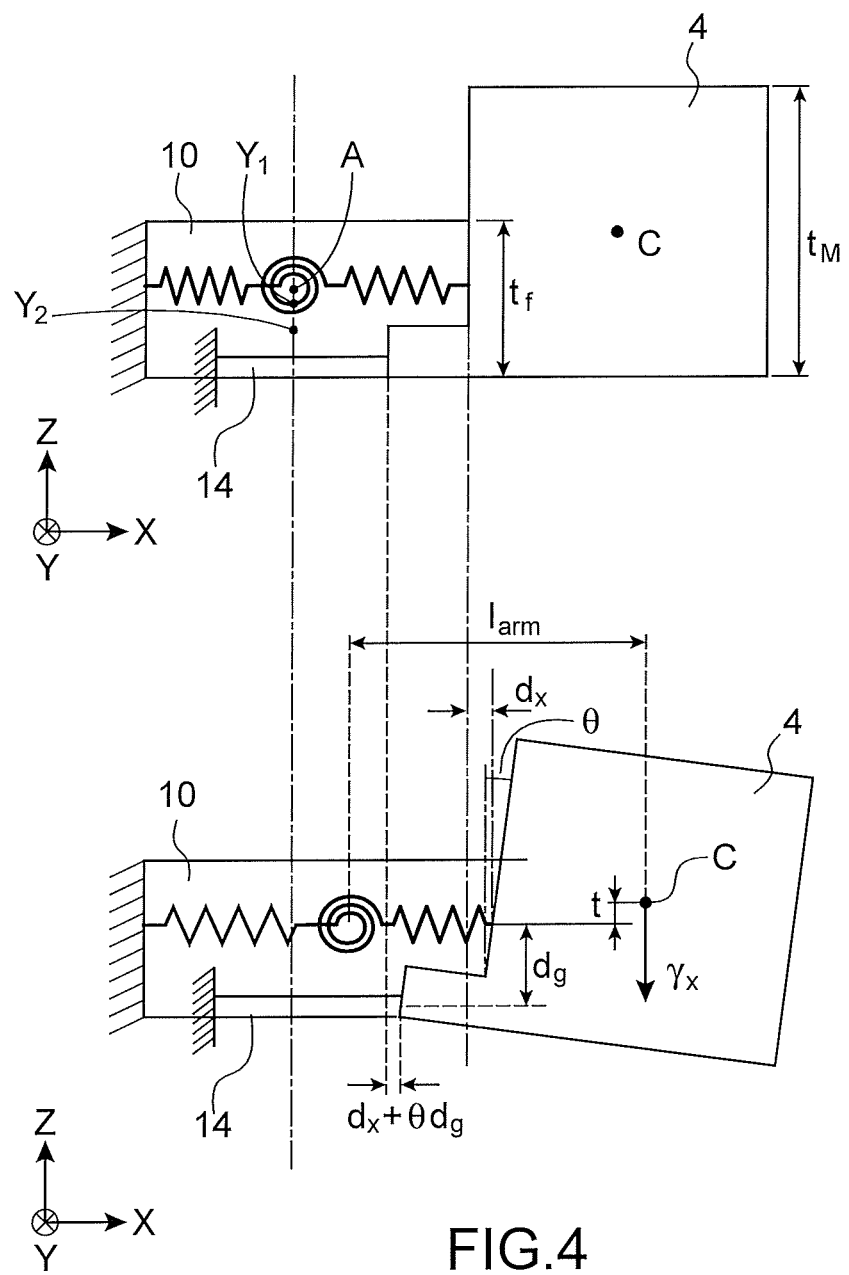
FIG. 4 is a diagrammatic representation of the sensor of FIGS. 1 and 2 undergoing an acceleration in the direction Z
Figures 5A, 5B:
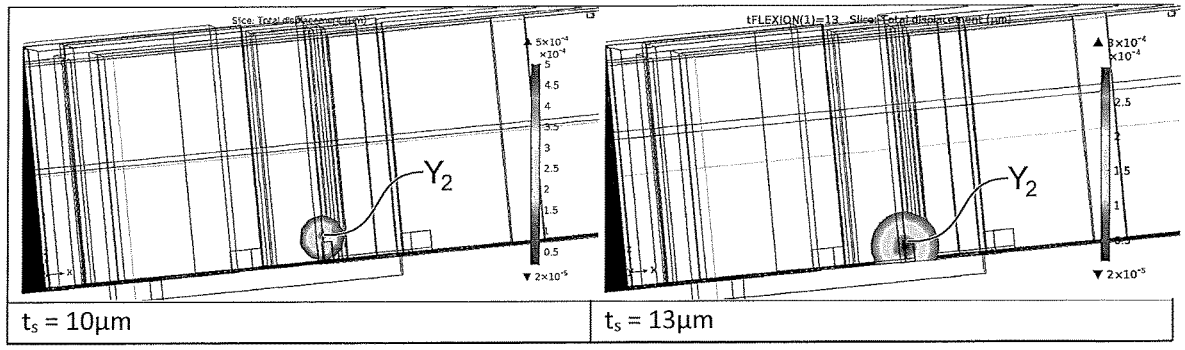
FIGS. 5A to 5E are images from a finite-element simulation of the structure of FIGS. 1 and 2 seen from the side and showing the location of the axis of rotation according to the thickness of the bending beams.
Figures 5C, 5D:
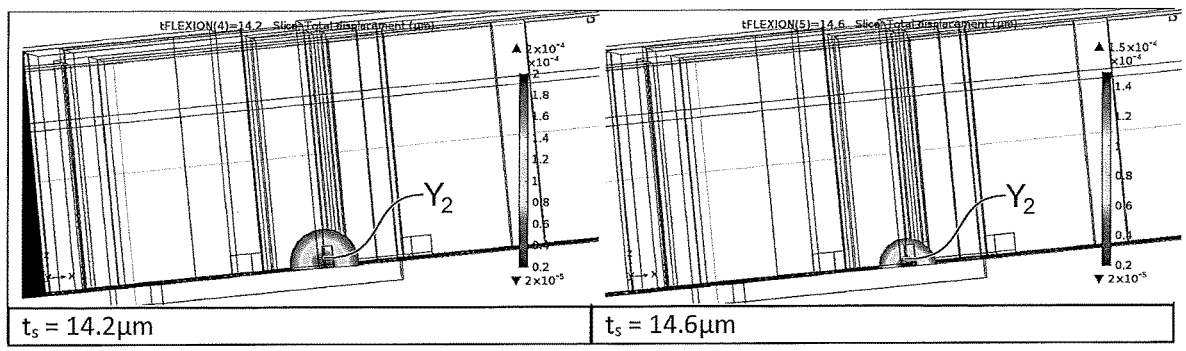
Figure 5E:
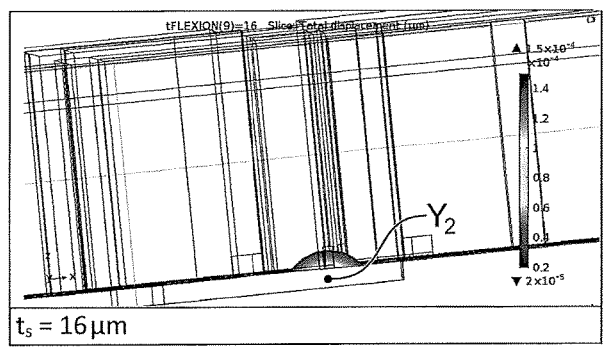

FIG. 4 shows the sensor of FIGS. 1 and 2 subjected to an acceleration along to Z.

The total force and total moments are therefore written:

$$0 = k_f\delta x + k_g(\delta x+\theta d_g)$$

$$-m\gamma_z l_{arm} = C_s\theta + k_g(\delta x+\theta d_g)d_g$$

With $l_{arm}$: distance in the plane between the centre of gravity C of the seismic mass and the centre of the bending beams projected onto X. The value of $l_{arm}$ is set during the design of the sensor, the dimensions of the sensor in the plane being fixed. Since small signals are worked with, the elongation of the bending beams is negligible during the movement of the mass.

$$F_{gau} = k_g(\delta x + d_g\theta) = -m\gamma_z l_{arm} \frac{\frac{d_g}{C_s}\frac{1}{\frac{1}{k_g} + \frac{1}{k_f} + \frac{d_g^2}{C_s}}}$$

The cross sensitivity $S_T$ is generally expressed as a percentage of the axial sensitivity.

The cross sensitivity is therefore defined by:

$$S_T = \frac{\left(\frac{F_{gau}}{\gamma_x}\right)}{\left(\frac{F_{gau}}{\gamma_z}\right)} = \frac{\frac{1}{k_f} - t\frac{d_g}{C_s}}{-l_{arm}\frac{d_g}{C_s}} = \frac{d_g}{l_{arm}}\left(\frac{t}{d_g} - \frac{C_s}{k_f d_g^2}\right) = \frac{1}{\Gamma}\left(\frac{t}{d_g} - \frac{C_s}{k_f d_g^2}\right)$$

With $$\Gamma = \frac{d_g}{l_{arm}} = \frac{t_f}{2l_{arm}};$$

moment arm or the structure when ignoring the thickness of the gauge.

The Bernoulli beam model allows to express the stiffnesses according to the Young's modulus and their geometry:

$$\left.\begin{array}{c}k_f = E\frac{w_f t_f}{l_f} \\ C_s = \frac{Ew_f t_f^3}{3\,l_f}\end{array}\right\} \Rightarrow \frac{C_s}{k_f} = \frac{t_f^2}{3}$$

The gauge pivot distance can also be expressed according to the geometry of the beams $$d_g = \frac{t_f}{2} - \frac{t_g}{2} \approx \frac{t_f}{2}$$

From which:

$$S_T = \frac{1}{\Gamma}\left(\frac{t_M}{t_f} - \frac{4}{3}\right) = \frac{1}{2l_{arm}}\left(t_M - \frac{4}{3}t_f\right) \quad (2)$$

Thus, the cross sensitivity is only dependent on the moment arm of the structure and on the ratio of the thicknesses of the mass and of the flexion arms.

This cross sensitivity is cancelled out for $t_f=3/4t_M$. Thus it is possible to define a structure of a sensor with an out-of-plane detection having a cross sensitivity of zero plus or minus the approximations due to the calculation hypotheses, which means that in a structure thus dimensioned the gauge does not undergo any elongation along X, when an acceleration in the direction X is applied. Indeed, by choosing such a ratio, the second axis of rotation of the structure Y2, during a stress in the plane, is located in the middle plane of the gauges the sum of the stresses is thus zero. In the specific case of FIGS. 3 and 4, it is in the middle of the gauges, the gauges thus undergo pure bending. When the axis Y2 is at the end of a gauge, the latter is more stressed but the sum of the stresses along X is still zero.

Generally, specifications in terms of cross sensitivity are set for each sensor model.

Via the invention, knowing the value of $S_T$ specified it is possible to define what the thickness of the bending beams and of the mass to be chosen are, in order to obtain a sensor with a sensitivity $S_T$.

Indeed, on the basis of the relation (2), the following can be written:

$$t_f = \frac{3}{4}(t_M - 2l_{arm}S_T). \quad (3)$$

For example, the specification on the maximum cross sensitivity is in general less than 1%. Thus, for $S_{Tmax}$=+/−0.5%, $t_M$=20 μm and $l_{arm}$=246 μm, $t_f$ can be determined.

13.1μm<$t_f$<16.8μm

Figure 6:
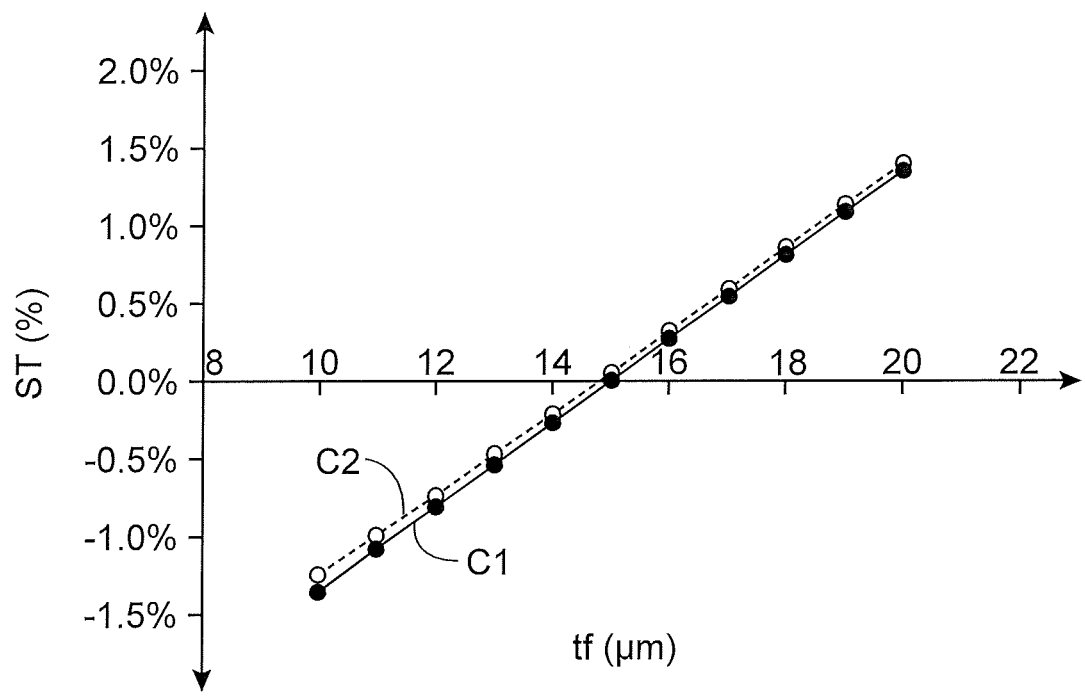
FIG. 6 is a graph of the variation in the cross sensitivity $S_T$ according to the thickness of the bending beams $t_f$.

FIG. 6 shows the variation in the cross sensitivity, in %/μN, according to the thickness $t_f$, in μm, of the bending beams for a mass having a thickness of 20 μm, calculated on the basis of the relation (II) (curve C1) and on the basis of a finite-element simulation (curve C2).

Good agreement between the analytical model established by the inventors and the finite-element simulation is observed. The sensitivity $S_T$ is cancelled out for $t_f$=14.6 μm.

FIGS. 5A to 5E show the position of the second pivot axis Y2 according to the thickness $t_f$ for a mass having a thickness $t_M$ equal to 20 μm, for an acceleration in the direction X of 100 g undergone by a structure such as that of FIG. 1.

FIGS. 5A, 5B, 5C, 5D and 5E respectively correspond to thicknesses $t_f$ equal to 10 μm, 13 μm, 14.2 μm, 14.6 μm and 16 μm.

These drawings show that the second axis of rotation Y2 moves towards the plane containing the gauges and is contained in this plane for a thickness of the bending beams equal to 14.6 μm. For this thickness, the axis Y2 is in the middle plane of the gauge, the sum of the stresses along X is zero, the cross sensitivity $S_T$ is zero.

It should be noted that the sensitivity S of the sensor with an out-of-plane detection, i.e. its sensitivity in the direction Z, decreases with an increase in the thickness of the bending beams, since their stiffness increases. It is possible to compensate for this decrease in sensitivity by increasing the seismic mass. This increase is obtained either by increasing the surface of the mass, i.e. its dimensions in the plane and/or by using a denser material.

Figure 7:
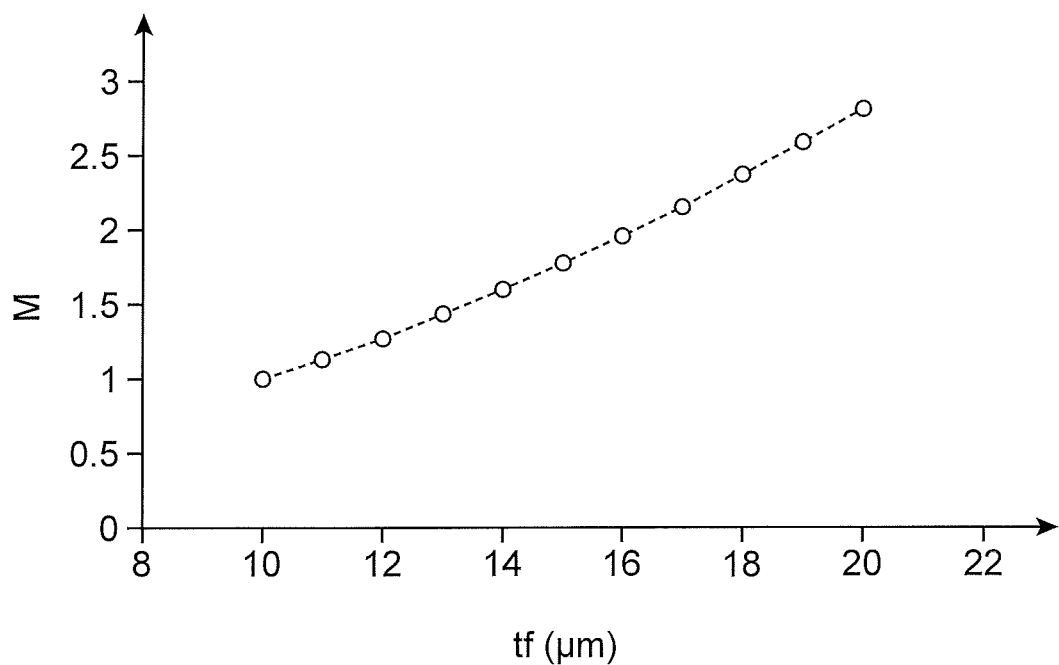
FIG. 7 is a graph of the variation in the normalised mass of the inertial mass according to the thickness of the bending beams $t_f$.

FIG. 7 shows the variation in the normalised seismic mass M according to the thickness $t_f$ of the bending beams when the sensitivity is constant. For example, with respect to a structure having bending beams having a thickness of 10 μm and a normalised mass 1, in order to preserve the same sensitivity with bending beams 15 μm thick, the mass is 1.8.

Examples of a method for realisation of a sensor with an out-of-plane detection having a controlled cross sensitivity will now be described.

During the design of the sensor, the desired cross sensitivity $S_T$ is set and the dimensions of the structure, namely the thickness of the mass and of the bending beams are determined. It is thus sought to create a sensor with a mass having a thickness $t_M$ and one or more bending beams having a thickness $t_f$ such that the relation (3) is satisfied.

FIGS. 8A to 8I show the elements obtained at various steps of realisation of a realisation method according to a first example of realisation.

A silicon on insulator substrate 100 or SOI (Silicon on Insulate in Anglo-Saxon terminology) comprising a support layer of silicon 102, a layer of electric insulator 104 and a layer of silicon 106 is used.

Figure 8A:
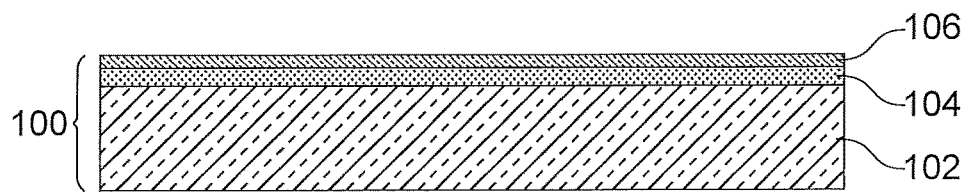
FIGS. 8A to 8I are diagrammatic representations of steps of an example of a method for realisation of a sensor with controlled sensitivity.

The substrate 100 is shown in FIG. 8A.

During a first step, the stress gauges are realised. For example, an implantation of the silicon of the layer 106 is carried out in order to adjust the resistance and the piezoresistive coefficient of the gauges. Then the layer 106 is structured in order to form the gauges, for example by photolithography and etching. The gauges 14 have nanometric dimensions.

Figure 8B:
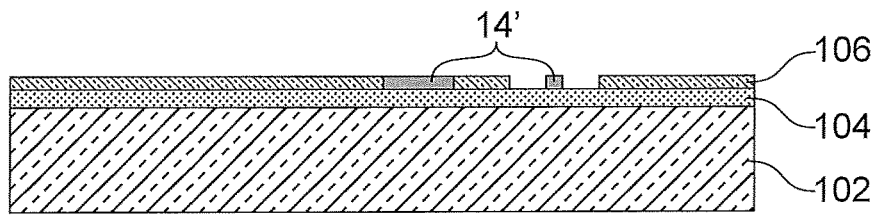

The element thus obtained is shown in FIG. 8B.

During a following step, the gauges are protected, for example by the deposition of a layer of oxide 107, for example a layer of silicon oxide.

Figure 8C:
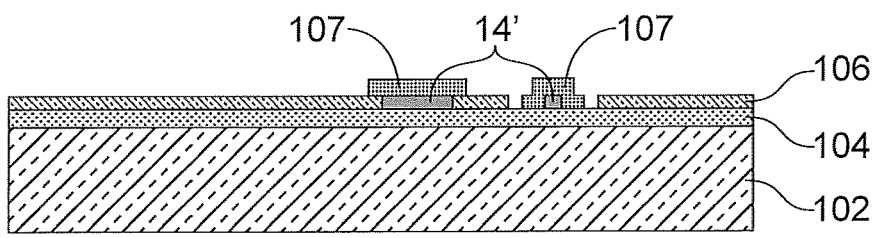

The element thus obtained is shown in FIG. 8C.

During a following step, a layer of silicon 108 is formed on the layer of silicon 106 in order to obtain a thickness of silicon equal to the desired thickness $t_M$ of the mass, i.e. the sum of the thickness of the layer 106 and that of the layer 108 equal to $t_M$. The thickness of the layer 106 is for example between 0.1 μm and 1 μm and the thickness of the layer 108 is example between 1 μm and 2 μm. Preferably, the layer 108 is formed by epitaxy. Preferably, the materials of the layers 106 and 108 are the same.

Alternatively, the layer 108 is formed by molecular gluing of a substrate, for example silicon, followed by a thinning.

Figure 8D:
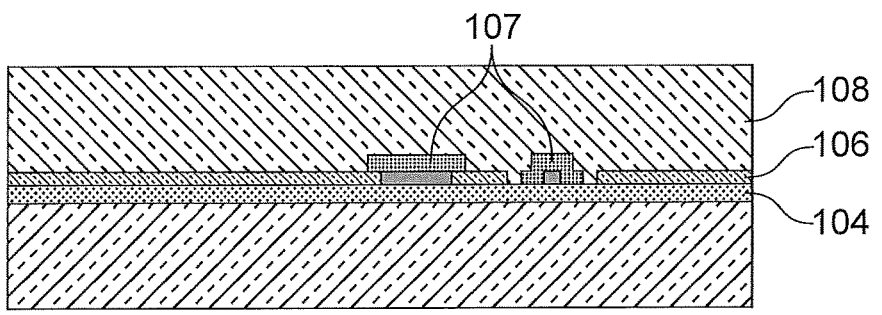

The element thus obtained is shown in FIG. 8D.

During a following step, a first mask M1, for example made of oxide, intended to define the structure, namely the mass 4, and a second mask M2, for example made of resin are realised on the location of the bending beam(s).

Figure 8E:
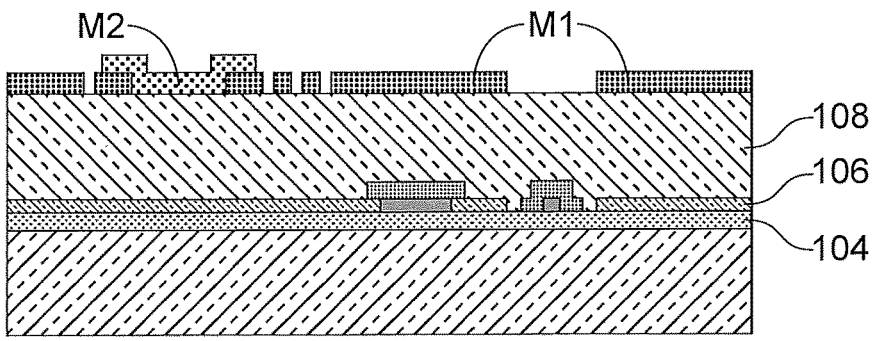

The element thus obtained is shown in FIG. 8E.

During a following step, the layers of silicon of the layers 106 and 108 are structured in order to form the structure, namely the mass, and in order to access the gauges, for example by deep etching, for example by deep reactive-ion etching or DRIE (Deep Reactive Ion Etching in Anglo-Saxon terminology).

Figure 8F:
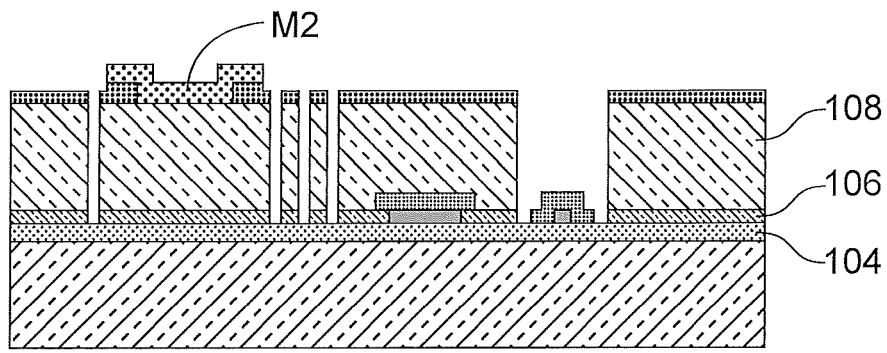

The element thus obtained is shown in FIG. 8F.

During a following step, the second mask M2 is removed.

Figure 8G:
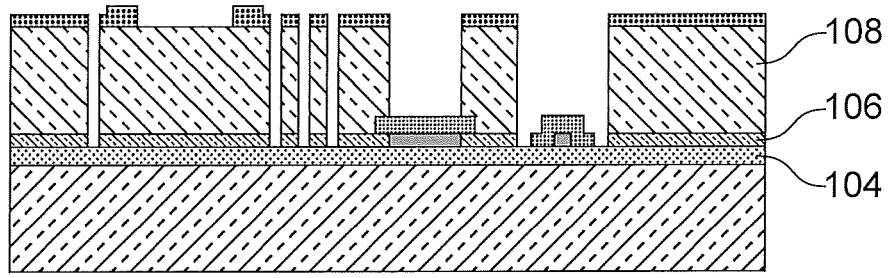

The element thus obtained is shown in FIG. 8G.

During a following step, the layer 108 is thinned at the location of the bending beam(s), i.e. at the location of the second mask M2. The layer 108 is thinned until the total thickness of the layer 106 and of the thinned layer 108 is equal to the value $t_f$ determined during the design of the sensor on the basis of the relation (3) for a given value of cross sensitivity.

The thinning is done by time for example by deep reactive-ion etching or DRIE (Deep Reactive Ion Etching in Anglo-Saxon terminology). The time of thinnings is calibrated.

Figure 8H:
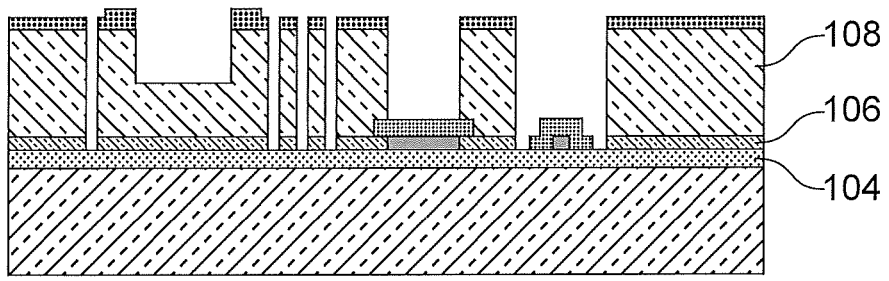

The element thus obtained is shown in FIG. 8H.

During a following step, the structure is released by removing the layer of oxide 104 under the mass, the beams and the gauges, the first mask M1 and the protective layer 107 of the gauges are advantageously simultaneously removed. The releasing is for example carried out via HF etching.

Figure 8I:
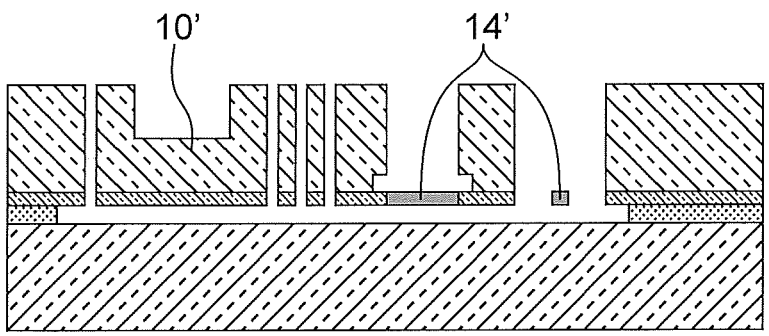

The element thus obtained is shown in FIG. 8I.

FIGS. 9A to 9K show various steps of another example of a method for realisation of a sensor with an out-of-plane detection according to the invention, offering greater precision in the setting of the thickness of the bending beams.

A silicon on insulator substrate 200 or SOI (Silicon on Insulate in Anglo-Saxon terminology) comprising a support layer of silicon 202, a layer of electric insulator 204 and a layer of silicon 206 is used.

Figure 9A:
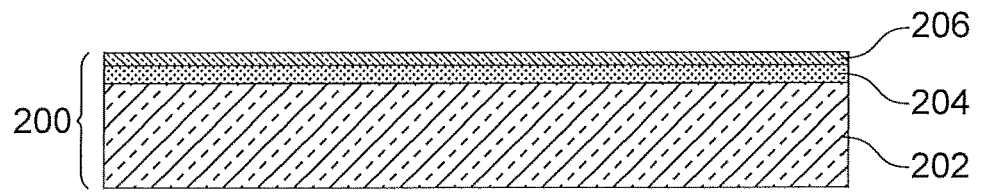
FIGS. 9A to 9K are diagrammatic representations of steps of an example of a method for realisation of a sensor with controlled sensitivity.

The substrate 200 is shown in FIG. 9A.

During a first step, the stress gauges are realised. For example, an implantation of the silicon of the layer 206 is carried out in order to adjust the resistance and the piezoresistive coefficient of the gauges. Then the layer 206 is structured in order to form the gauges, for example by photolithography and etching. The gauges 14' have nanometric dimensions.

Figure 9B:
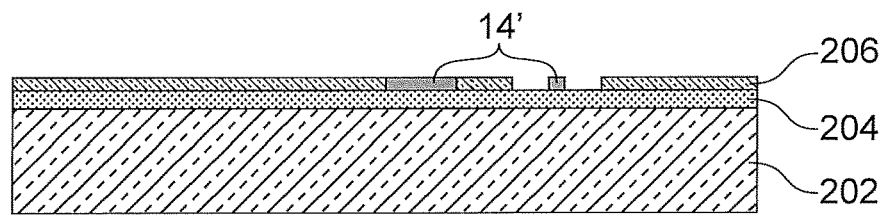

The element thus obtained is shown in FIG. 9B.

During a following step, the gauges are protected, for example by the deposition of a layer of oxide 207, for example a layer of silicon oxide.

Figure 9C:
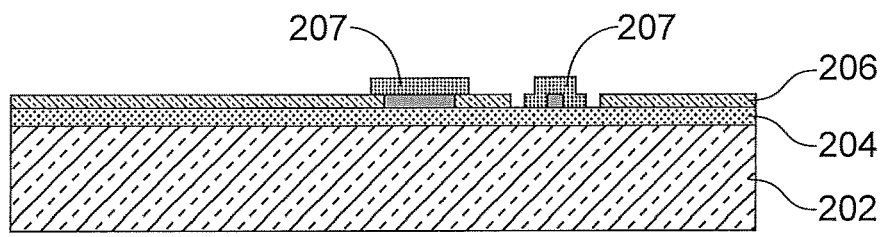

The element thus obtained is shown in FIG. 9C.

During a following step, a layer of silicon 208 is formed on the layer 206 in such a way that the thickness formed by the layer 206 and of the layer 208 is equal to the desired thickness $t_f$. The layer 208 is formed for example by epitaxy.

Figure 9D:
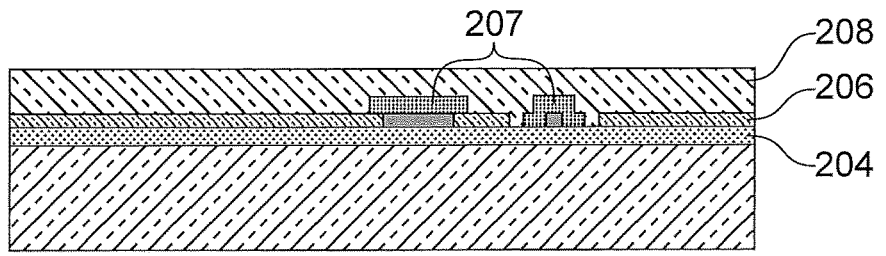

The element thus obtained is shown in FIG. 9D.

During a following step, a barrier layer is formed, for example a layer of oxide and then it is structured, for example by etching, in such a way as to only preserve a barrier portion 210 vertically aligned with the location of the bending beam(s). The layer of oxide is similar to the layer of oxide 207 formed in order to protect the gauges.

Figure 9E:
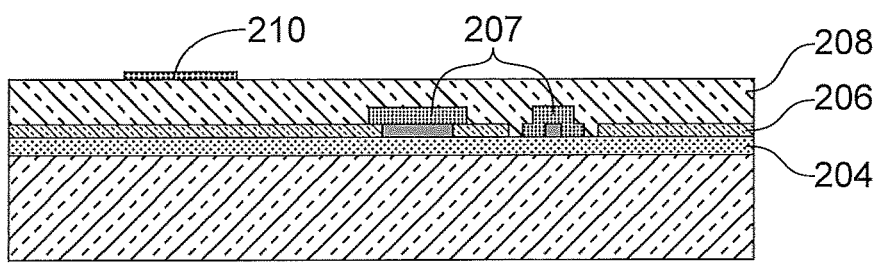

The element thus obtained is shown in FIG. 9E.

During a following step, a layer of silicon 212 is formed on the layer of silicon 208 and on the barrier portion Z10, for example by epitaxy. The thickness of the layer 212 is such that the sum of the thicknesses of layers 206, 208 and 112 is equal to the desired thickness $t_M$ of the mass.

Figure 9F:
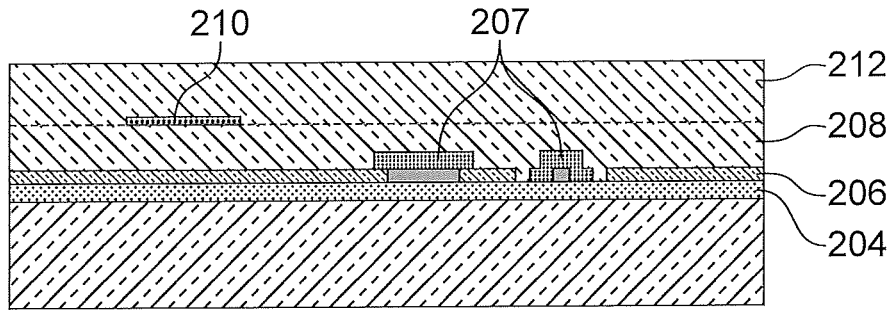

The element thus obtained is shown in FIG. 9F.

During a following step, a first mask M1', for example made of oxide, intended to define the structure, namely the mass, and a second mask M2', for example made of resin are realised on the location of the bending beam(s).

Figure 9G:
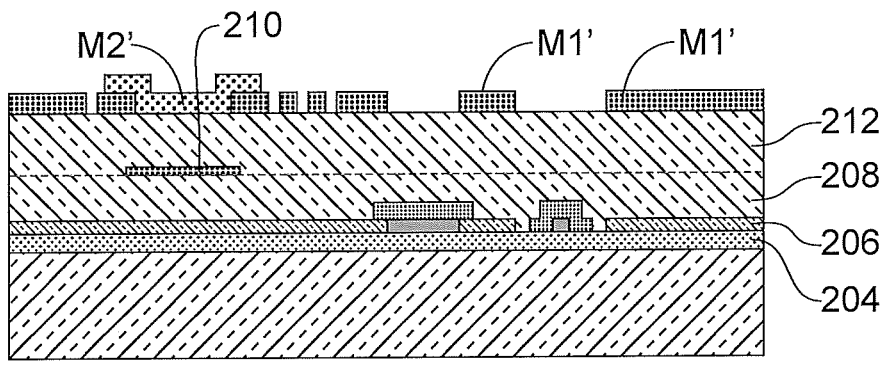

The element thus obtained is shown in FIG. 9G.

During a following step, the layers of silicon of the layers 206, 208 and 212 are structured in order to form the structure, namely the mass, and in order to access the gauges, for example by deep etching, for example by deep reactive-ion etching or DRIE (Deep Reactive Ion Etching in Anglo-Saxon terminology).

Figure 9H:
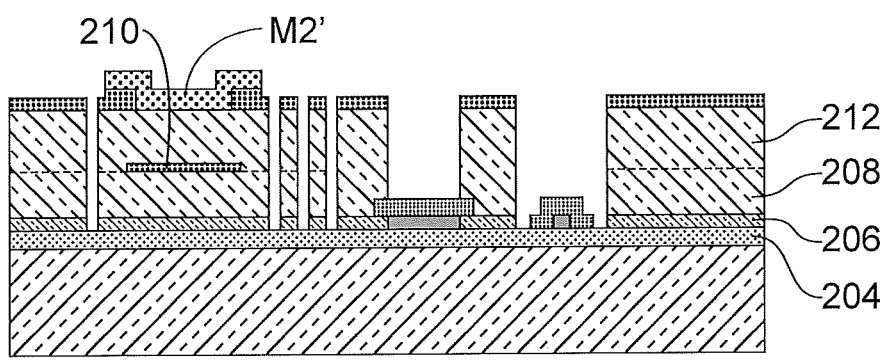

The element thus obtained is shown in FIG. 9H.

During a following step, the second mask M2' is removed.

Figure 9I:
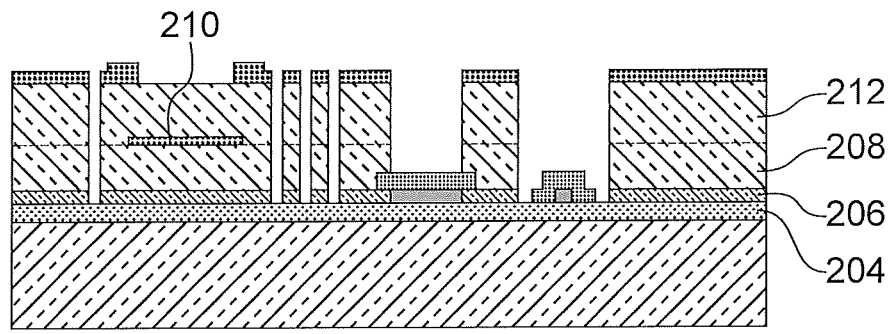

The element thus obtained is shown in FIG. 9I.

During a following step, the layer 212 is etched until the barrier portion 210 at the location of the bending beam(s), i.e. at the location of the second mask M2', is reached.

Figure 9J:
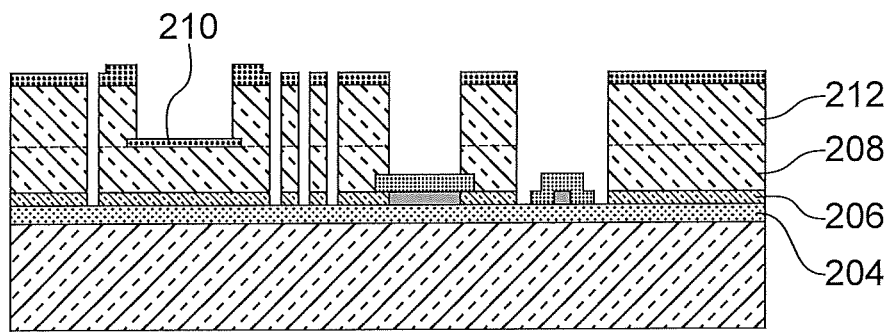

The element thus obtained is shown in FIG. 9J.

During a following step, the structure is released by removing the layer of oxide 204 under the mass, the beams and the gauges, the first mask M1, the protective layer 207 of the gauges and the barrier portion 210 are advantageously simultaneously removed. The releasing is for example carried out by HF etching.

Figure 9K:
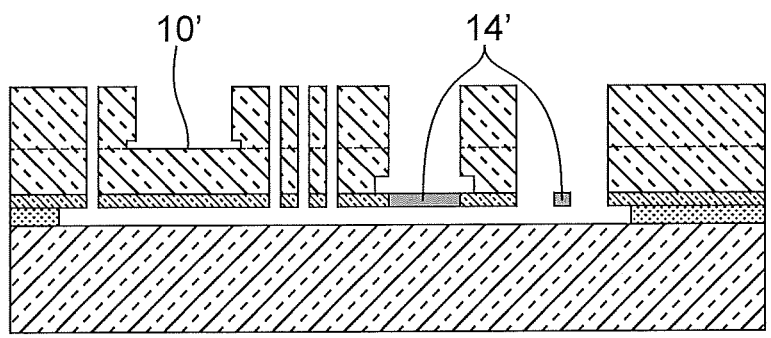

The element thus obtained is shown in FIG. 9K.

The thickness of the bending beam(s) is defined more precisely by the method of FIGS. 9A to 9K.

The structure can be made from a semiconductor material other than silicon, it can be made for example the SiGe, SiC.

It is also understood that the substrate 100 can be realised during the manufacturing method.

The invention claimed is:

1. Microelectromechanical sensor with an out-of-plane detection having a cross sensitivity in a first direction in the plane with a value $S_T$, said sensor comprising a support, an inertial mass suspended from the support by suspension means, a first axis of rotation about which the inertial mass pivots with respect to the support in an out-of-plane direction when the sensor is subjected to a stress in the out-of-plane direction, said suspension means comprising at least one first beam in the plane, said at least one first beam being anchored by a longitudinal end to the support and by another longitudinal end to the inertial mass, in such a way that during a movement of the inertial mass in the out-of-plane direction, said at least first beam is stressed by bending, and means for detection of the movement of the mass in the out-of-plane direction, said detection means comprising at least one first stress gauge suspended by a first end from the inertial mass and by a second end from the support and extending in parallel to said at least one first beam, wherein said to the first beam has a dimension $t_f$ in the out-of-plane direction and the inertial mass has a dimension $t_M$ in the out-of-plane direction such that $$t_f = \frac{3}{4}(t_M - 2l_{arm}S_T)$$

$l_{arm}$ being a distance between the centre of gravity of the inertial mass and the centre of the at least one first beam projected onto the first longitudinal direction.

2. Microelectromechanical sensor according to claim 1, wherein the dimension in the out-of-plane direction tf of the first beam is chosen as equal to ¾ of the dimension in the out-of-plane direction $t_M$ of the mass in such a way that the sensor has a cross sensitivity with a value $S_T$ of zero or almost zero.

3. Microelectromechanical sensor according to claim 1, wherein the suspension means comprise at least two first beams.

4. Microelectromechanical sensor according to claim 1, wherein the suspension means comprise at least one second beam and intended to be stressed in torsion during the movement of the inertial mass in the out-of-plane direction.

5. Microelectromechanical sensor according to claim 1, wherein the sensor comprises a second axis of rotation about which the inertial mass pivots with respect to the support in an out-of-plane direction when the sensor is subjected to a stress in the direction in the plane and wherein said second axis of rotation is located in the middle plane of the first gauge.

6. Microelectromechanical sensor itself according to claim 1, wherein the cross sensitivity is comprised in an interval [−1%; +1%].

7. Microelectromechanical sensor according to claim 1, wherein the detection means comprise a second stress gauge suspended and disposed with respect to the first gauge in such a way as to allow a differential measurement.

8. A method for manufacturing the sensor according to claim 1, comprising:

realizing at least one first stress gauge in a first electrically conductive or semiconductor layer, formed on a barrier layer formed on a support layer the formation of a protective layer only on said at least one first stress gauge, the formation of a second electrically conductive or semiconductor layer on the first layer and on the protective layer, in such a way that the thickness of the first and of the second layer is equal to the thickness of the inertial mass $t_M$, the formation of a first mask in order to define the inertial mass, the formation of a second mask vertically aligned with the location of the at least first beam, the structuration of the first and second electrically conductive or semiconductor layers in such a way as to define the inertial mass and reach the protective layer of the at least one first gauge,
the removal of the second mask,
the thinning of the second electrically conductive or semiconductor layer in such a way as to remove a thickness of conductive or semiconductor material equal to $t_M-t_f$,
the releasing of the inertial mass, of the at least one first gauge and of the at least first beam.

9. Manufacturing method according to claim 8, wherein the first mask is made of oxide and the second mask is made of resin.

10. Manufacturing method according to claim 8, wherein the second layer and the third layer are formed by epitaxy.

11. A method for manufacturing the sensor according to claim 1, comprising:
realizing at least one first stress gauge in a first electrically conductive or semiconductor layer, formed on a barrier layer formed on a support layer
the formation of a protective layer only on said at least one first stress gauge,
the formation of a second electrically conductive or semiconductor layer on the first layer and on the protective layer, in such a way that the thickness of the first and of the second layer is equal to the thickness of the first beam $t_f$,
the formation of a barrier portion on the second electrically conductive or semiconductor layer vertically aligned with the location of the at least first beam,
the formation of a third electrically conductive or semiconductor layer on the second electrically conductive or semiconductor layer and on the barrier portion, in such a way that the thickness of the first, of the second and of the third layer is equal to the thickness of the inertial mass $t_M$,
the formation of a first mask in order to define the inertial mass and a second mask vertically aligned with the barrier portion,
the structuration of the first, second and third electrically conductive or semiconductor layers in such a way as to define the inertial mass and reach the protective layer of the at least one first gauge,
the removal of the second mask,
the thinning of the second electrically conductive or semiconductor layer in such a way as to remove a thickness of conductive or semiconductor material equal to $t_M-t_f$,
the releasing of the inertial mass, of the at least one first gauge and of the at least first beam.

12. Manufacturing method according to claim 11, wherein the first mask is made of oxide and the second mask is made of resin.

13. Manufacturing method according to claim 11, wherein the second layer and the third layer are formed by epitaxy.

14. Method for designing a microelectromechanical sensor with an out-of-plane detection having a cross sensitivity in a first direction in the plane with a value $S_T$, said sensor comprising a support, an inertial mass suspended from the support by suspension means in such a way that the inertial mass is capable of moving in rotation with respect to the support in an out-of-plane direction, about a first axis of rotation, said suspension means comprising at least one first beam extending in the plane of the sensor and orthogonally to the first axis of rotation of the suspension means, said at least one first beam being anchored by a longitudinal end to the support and by another longitudinal end to the inertial mass in such a way that during a movement of the inertial mass in the out-of-plane direction said at least first beam is stressed by bending, and means for detection of the movement of the inertial mass in the out-of-plane direction, said detection means comprising at least one first stress gauge suspended by a first end from the inertial mass and by a second end from the support and extending in parallel to said at least one first beam, the design method comprising at least:
a step of determination of the dimension $t_f$ in the out-of-plane direction of the at least one first beam and of the out-of-plane dimension $t_M$ of the inertial mass such that $$t_f = \frac{3}{4}(t_M - 2l_{arm}S_T)$$

$l_{arm}$ being a distance between the centre of gravity of the inertial mass and the centre of the at least one first beam projected onto the first direction.

15. Design method according to claim 14, comprising a step of selection of the dimensions in the plane of the inertial mass, said dimensions in the plane of the inertial mass being chosen in such a way that the sensor has a sensitivity S and at least one first beam having a thickness $t_f$.

* * * * *